United States Patent [19]

Shah et al.

[11] Patent Number: 5,270,875
[45] Date of Patent: Dec. 14, 1993

[54] PROGRAMMABLE FILTER/EQUALIZER FOR DUEL SPEED AND DENSITY MAGNETIC RECORDING DEVICES

[75] Inventors: Prabodh L. Shah, San Diego, Calif.; Ronald R. Kennedy, Fort Collins, Colo.

[73] Assignee: Colorado Memory Systems, Inc., Loveland, Colo.

[21] Appl. No.: 612,571

[22] Filed: Nov. 13, 1990

[51] Int. Cl.$^5$ .................. G11B 5/09; G11B 15/12; G11B 5/035
[52] U.S. Cl. ........................... 360/46; 360/61; 360/65
[58] Field of Search ............ 360/45, 46, 65, 67, 360/61

[56] References Cited

U.S. PATENT DOCUMENTS

| | | | |
|---|---|---|---|
| 4,244,008 | 1/1981 | Holt | 360/45 |
| 4,314,288 | 2/1982 | Gyl | 360/65 |
| 4,371,901 | 2/1983 | Shah | 360/65 |
| 4,656,533 | 4/1987 | Sakai et al. | 360/46 |
| 4,894,734 | 1/1990 | Fischler | 360/51 |

*Primary Examiner*—Donald Hajec
*Assistant Examiner*—Won Tae C. Kim
*Attorney, Agent, or Firm*—Dorr, Carson, Sloan & Peterson

[57] ABSTRACT

A programmable filter for the read channel of a magnetic recording device filters the sensed signals corresponding to data on magnetic media at at least two different transfer speeds of the magnetic media. The programmable filter, under microprocessor control, selectively switches its filter characteristics without affecting the quality of the filter but changing the cut-off frequency so as to correspond to the two different transfer speeds. The programmable filter of the present invention utilizes solid state switches to implement the switching of the filter characteristics to change the cut-off frequency without affecting the quality. The programmable filter is inductorless and is designed only with resistors and capacitors arranged in a filter network. The programmable filter does not use operational amplifiers, using instead low cost transistors in an emitter-follower configuration. The cut-off frequency of the filter is changed by adding resistance or capacitance in series or in parallel with existing resistances and capacitances in the resistor-capacitor network so as to change the cut-off frequency without affecting the quality. The programmable filter of the present invention provides pulse slimming thereby reducing intersymbol interference, provides sharp roll-off characteristics to minimize higher frequency noise, and produces a voltage output corresponding to the sensed data signals as well as a differentiated voltage output having the identical delay as the voltage output.

36 Claims, 6 Drawing Sheets

PROGRAMMABLE FILTER/EQUALIZER FOR DUEL SPEED AND DENSITY MAGNETIC RECORDING DEVICES

BACKGROUND OF THE ART

1. Field of the Invention

The present invention relates to field of programmable filters and equalizers and, in particular, relates to programmable filters/equalizers for dual speed and density magnetic recording devices.

2. Statement of the Problem

The original IBM personal computer utilized a floppy controller having a transfer rate of 250 Kb/s (Kilobits per second) for transfer of data to a floppy disk. With the introduction by IBM of its Model AT, the transfer rate increased to 500 Kb/s. It is to be expected that future transfer rates will continue to increase, e.g., to 1000 Kb/s.

One "add-on" peripheral device in the marketplace is a tape backup drive which operates off the conventional floppy controller interface with the IBM (and others) personal computer. This tape drive serves as a backup for the data in the hard disk of the personal computer. Optimally, tape backup drives should operate at the highest transfer rate available in order to minimize the time for backing up the data. A problem exists in being capable of handling data backup in a single drive at the two conventional rates of 250 Kb/s and 500 Kb/s.

Presently, most tape backup manufacturers solve the dual transfer rate problem by designing two separate drives—one for the 250 Kb/s transfer rate and a second one for the 500 Kb/s transfer rate. This clearly increases inventory costs for both the drive manufacturer and the distributor of the drive manufacturer's products.

Other drive manufacturers optimize the design of their drive by designing the drive to function at the highest transfer rate and reading at both rates. Doing so, however, causes loss of performance in terms of error rate at the lower transfer rate. The amplitude of the signal coupled to the magnetic playback head is proportional to the rate of change of the magnetic flux with respect to time. A lower transfer rate equates to a decreased speed and, therefore, the signal output is decreased proportionately, causing an increase in the error rate at the lower transfer speed.

A need, therefore, exists to design a tape backup drive which can automatically sense between the available transfer rates and optimize the performance of the read channel to the fastest transfer rate. However, a need further exists that while operating at the lower transfer rate, any increase in error rate should be substantially eliminated. Hence, a single programmable filter which may be scaled down from the higher to the lower transfer rate wherein the error rate at the lower transfer rate does not increase is desired. A need exists to be able to modify the characteristics of the filter when changing tape speed so that the signal-to-noise ratio will not be reduced by the ratio of the change in tape speed. For example, decreasing the transfer rate from 1000 Kb/s to 500 Kb/s reduces the signal-to-noise ratio by 6 dB if the filter is unchanged. This results in a signal level decrease of 50% while the noise remain constant. A need exists for the characteristics of the filter to be scaled by one-half so as to maintain the same relationship between the cut-off frequency of the filter and the spectral content of the code so that the noise present would also be decreased by dB. A filter satisfying this need would allow a single backup tape drive to be optimized on either the PC or AT class of computers as required by the maximum available transfer rate.

3. Results of a Patentability Search

A patentability search was directed to the above problem which resulted in the following patents:

| INVENTOR | U.S. PAT. NO. | ISSUE DATE |
|---|---|---|
| Gyi | 4,314,288 | 2-2-82 |
| Shah | 4,371,901 | 2-1-83 |
| Fischler et al. | 4,894,734 | 1-16-90 |

U.S. Pat. No. 4,314,288 sets forth an amplitude and phase equalizer which utilizes inductors, resistors, and capacitors to be selectively switched into or out from the frequency amplitude and phase equalizer so as to allow program control over the frequency thereof. The '288 patent finds application in single speed or multi-speed magnetic recording/playback devices.

U.S. Pat. No. 4,371,901 pertains to a programmable signal equalizer utilizing a plurality of active resistor-capacitor circuits arranged to be controlled by a ladder resistor network. The ladder circuits are selectively activated by digital word signals representative of the selective magnetic tape speed to produce a signal equalization operation at each of the selected tape speeds.

U.S. Pat. No. 4,894,734 sets forth a method and apparatus for constant density recording which provides a set of electronics that can be reconfigured upon selective switching to produce a desired frequency response. The selection is under control of a microprocessor.

Each of the above patented approaches provides its unique solution to the above stated problem. The '288 and '734 approaches, however, utilize expensive inductors. Inductors are costly and are sensitive to external fields. They are usually large (occupying valuable space on a printed circuit board) and generally have non-ideal performance. Hence, a further need exists, one not solved by the above two patents, in designing a programmable filter/equalizer which does not utilize inductors. The '901 patent does not utilize costly inductors, but utilizes expensive operational amplifiers. Hence, a further need exists to provide a programmable filter/equalizer which does not utilize expensive operational amplifiers.

Hence, while the above approaches provide various solutions to the above stated problem, the solutions are expensive to implement and exhibit non-ideal performance. Hence, a need exists for a low-cost programmable filter/equalizer which does not utilize inductors or operational amplifiers and which switches only resistors to obtain the different filter characteristics required to solve the above stated problem.

4. Solution to the Problem

The present invention is a programmable filter/equalizer for dual speed and density magnetic recording devices. The present invention utilizes a filter that is capable of scaling its magnitude and phase response over a 2:1 range as required by the dual transfer rates and a real densities of magnetic recording devices used in personal computers. The filter of the present invention is implemented utilizing three cascaded second order active filter stages and a first order passive filter stage which can be selectively switched. The same filter has the further advantages of reducing intersymbol interference (by pulse slimming) in the reading of data and it further delivers a differentiated output having the same delay as the filtered output.

SUMMARY OF THE INVENTION

A programmable filter for the read channel or a magnetic recording device filters the sensed signals corresponding to data on magnetic media at at least two different transfer speeds of the magnetic media. The programmable filter, under microprocessor control, selectively switches its filter characteristics without affecting the shape of the filter response but changing the cut-off frequency so as to correspond to the two different transfer speeds. The programmable filter of the present invention utilizes solid state switches to implement the switching of the filter characteristics to change the cut-off frequency without affecting the shape. The programmable filter is inductorless and is designed only with resistors and capacitors arranged in a filter network. The programmable filter does not use operational amplifiers, using instead low cost transistors configured as emitter followers. The cut-off frequency of the filter is changed by adding resistance or capacitance in series or in parallel with existing resistances and capacitances in the resistor-capacitor network so as to change the cut-off frequency without affecting the shape. The programmable filter of the present invention is composed of several filtering stages arranged so as to provide pulse slimming thereby reducing intersymbol interference while providing sharp roll-off characteristics to minimize higher frequency noise. Finally, the output of the programmable filter produces a voltage output corresponding to the sensed data signals as well as a differentiated voltage output having the identical delay as the voltage output.

Operational Environment

Figure 1:
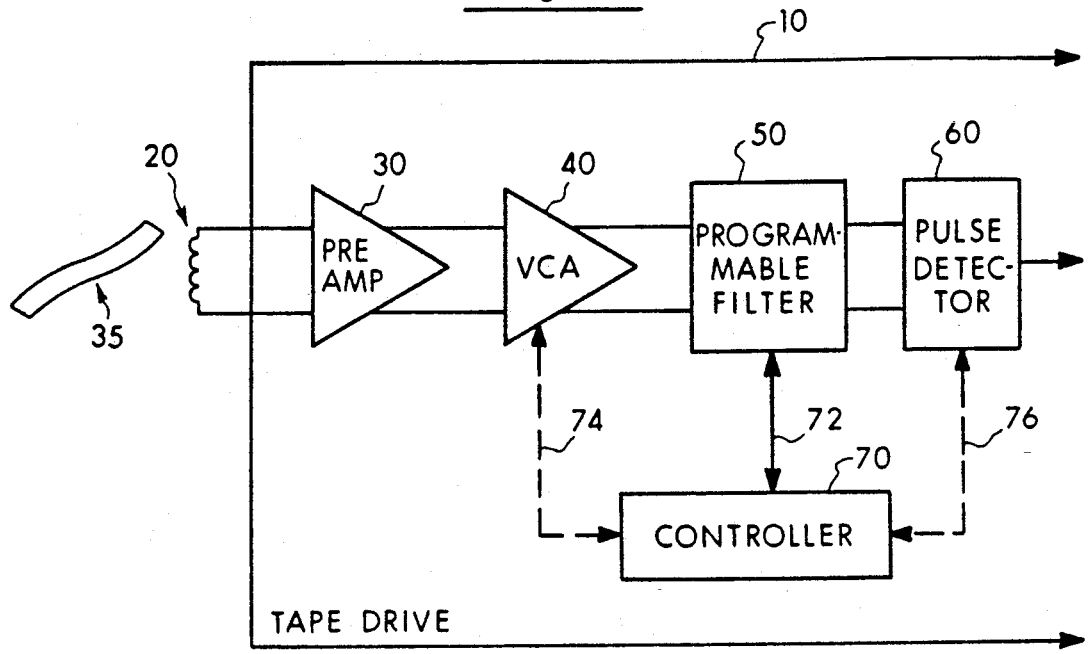
FIG. 1 sets forth the block diagram of the components of the front end of a tape drive.

In FIG. 1, a portion of a tape drive 10 is shown having a magnetic head 20 for reading data on a tape 35. The signals from the magnetic head corresponding to the data being read are delivered into a preamplifier 30 which in turn delivers the signals into a voltage controlled amplifier (VCA) 40 and then to a programmable filter 50. The output of the programmable filter 50 is delivered into a pulse detector 60. Under the teachings of the present invention, a controller 70 is interconnected over line 72 to the programmable filter 50. The controller 70 may also optionally communicate with the VCA 40 and the pulse detector 60 over lines 74 and 76.

The programmable filter 50 can be selectively switched by the controller 70 over line 72 so as to operate at one of two transfer rates—for example, 250 and 500 Kb/s (corresponding to the QIC-40) or 500 and 1000 Kb/s (corresponding to the QIC-80). The programmable filter 50 provides performance significantly better than a corresponding single passive filter at a cost considerably less than switching two separate passive filters. Furthermore, as will become apparent, only resistors and capacitors are switched under the teachings of the present invention in a filter which is inductorless and which does not use operational amplifiers. When implemented on a hybrid, a low cost filter occupying less real estate on a printed circuit board is obtained.

Second Order Active Low Pass Filter Stage

Figure 2:
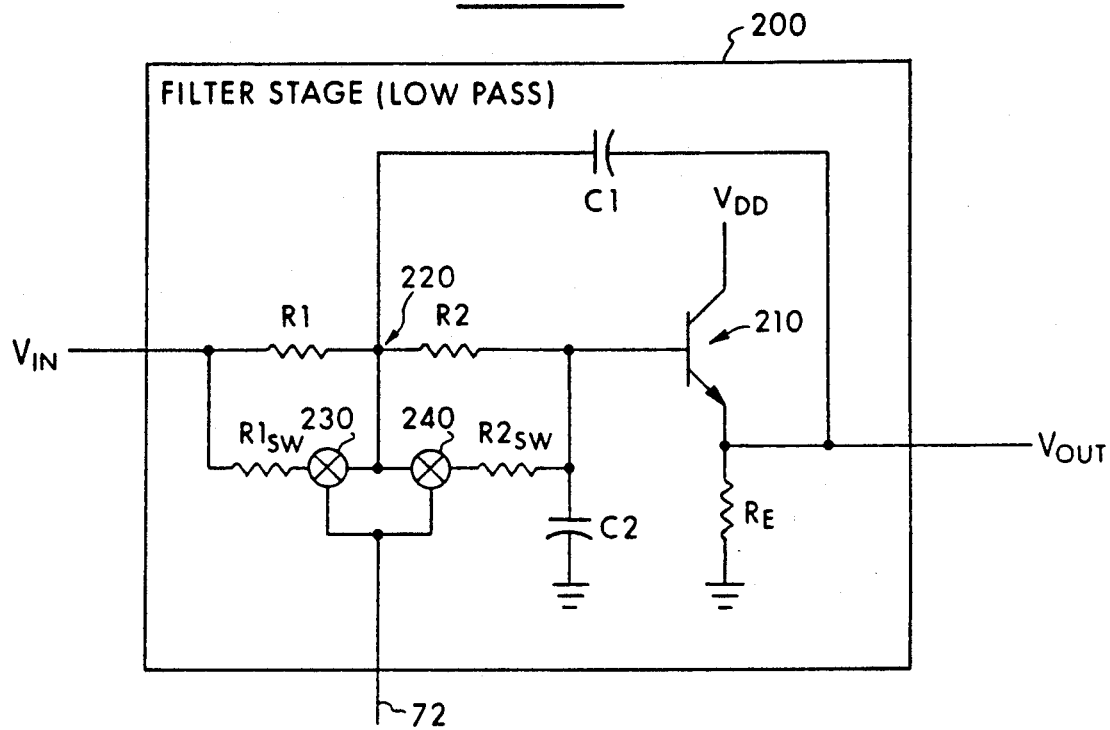
FIG. 2 sets forth the schematic of a low pass filter stage of the present invention.

In FIG. 2, a second order active low pass filter stage of the present invention is set forth. In FIG. 2, the filter stage 200 is connected at a voltage input, $V_{in}$, and delivers a filtered voltage out, $V_{out}$. The filter stage 200 is under control of the controller 70 via line 72. When the filter stage 200 is configured to the lower frequency transfer rate, the filter is comprised of resistors R1 and R2 in series between the voltage $V_{in}$ and the base of the emitter follower transistor 210. The base of transistor 210 is connected through capacitor C2 to ground. The collector of transistor 210 is connected to a voltage source, $V_{DD}$, and the emitter of the transistor 210 is connected to the voltage out, $V_{out}$. A capacitor C1 is connected from point 220 between resistors R1 and R2 to the output $V_{out}$. A resistor $R_E$ is connected from $V_{out}$ to ground.

Solid state switches 230 and 240 are located so as to selectively place resistors $R1_{SW}$ and $R2_{SW}$ in parallel with resistors R1 and R2 respectively. Hence, when the filter stage 200 is to be programmed to operate at the higher tape speed transfer rate, switches 230 and 240 are activated to connect $R1_{SW}$ and $R2_{SW}$ in parallel with resistors R1 and R2.

In the preferred embodiment, the components set forth in FIG. 2 have the following values:

R1=R2=1 Kilo-ohm
$R1_{SW}$=$R2_{SW}$=1 Kilo-ohm
$R_E$=680 to 1.3 Kilo-ohms
Transistor 210=Model MMBTH10 (NPN) or MMBTH81 (PNP)
Switches 230 and 240=Model HC4066

Capacitors C1 and C2 vary in value as required by the desired pole locations. The pole locations are set corresponding to a Bessel filter to provide the desired phase characteristic.

While the preferred embodiment has resistor R1 equal to $R1_{SW}$, it is to be expressly understood that under the teachings of the present invention any values or relationship of values for resistors R1, $R1_{SW}$, R2, $R2_{SW}$ could be utilized. However, high precision resistors having a precision of one percent or less must be used. There is an alternate method which could be used for setting the filter response which does not require precision trimmed resistors but instead trims the RC product to be within predetermined limits. This eliminates the need for 1% resistors.

The filter stage 200 of FIG. 2 is a second-order filter stage implemented with a unity gain amplifier (i.e., transistor 210). The transfer function for filter stage 200 can be described in the complex frequency plane in terms of "$\omega_0$" and "Q" where $\omega_0$ controls the cut-off frequency of the filter and Q controls the peaking of the frequency response at the cut-off frequency. The transfer function equation for FIG. 2, in the ideal case, where transistor 210 has unity gain is set forth in FORMULA 1 below:

$$\frac{V_{out}}{V_{in}} = \frac{\omega_0^2}{s^2 + s\frac{\omega_0}{Q} + \omega_0^2}$$

where
s = j 2π f
f = frequency in Hz

Quality, Q, is set forth in FORMULA 2 below and is determined by:

$$Q = \frac{1}{2}\sqrt{\frac{C_1}{C_2}}$$

It is observed that the values of the resistors do not affect quality. Q defines the amount of peaking of a second order low pass or high pass filter at $\omega_0$ (i.e., a second order filter with a Q of 2 will have 6 dB of peaking at $\omega_0$).

The cut-off frequency, $\omega_0$, is set forth in FORMULA 3 below and is determined by:

$$\omega_0 = \frac{1}{R\sqrt{C_1 \cdot C_2}}$$

Assuming R1 = R2 = R.

The ratios of the capacitors C1 and C2 therefore control the quality, Q, of the filter stage while the value of the resistors R independently controls the cut-off frequency, $\omega_0$.

Under the teachings of the present invention, therefore, the quality Q of the filter stage 200 is fixed by the values of capacitors C1 and C2, whereas the cut-off frequency for the filter stage 200 is determined by the values of the resistance R. As set forth in FIG. 2 and assuming resistances R1 = R2 = R1$_{SW}$ = R2$_{SW}$ = R, then when R1$_{SW}$ and R2$_{SW}$ are switched in, the value of R in Formula 3 above becomes R/2. This increases the cut-off frequency, $\omega_0$, by a factor of two as set forth in FORMULA 4 BELOW:

$$\omega_0 = \frac{2}{R\sqrt{C_1 \cdot C_2}}$$

Hence, it can be observed with respect to FIG. 2 and in the above equations, that simply switching resistance causes the quality, Q, of the filter stage 200 to remain the same but changes the cut-off frequency. This is an important feature of the present invention. More importantly, any values of resistance can be suitably selected under the teachings of the present invention. While the filter stage is shown to be selectively switched between two cut-off frequencies, it is important to understand that more than two frequencies could be selected. For example, three cut-off frequencies could be selected corresponding to three transfer speeds (such as 250 Kb/s, 500 Kb/s and 1000 Kb/s) by selectively switching two sets of resistors rather than just one set of resistors (R1$_{SW}$ and R2$_{SW}$).

The signals delivered on line 72 from the controller 70 are HIGH or LOW signals. In the preferred embodiment, a HIGH signal on line 72 causes switches 230 and 240 to turn on, thereby placing resistances R1$_{SW}$ and R2$_{SW}$ in parallel with resistors R1 and R2. If a LOW signal is delivered then the switches 230 and 240 are open and the resistances R1$_{SW}$ and R2$_{SW}$ are not in the circuit. Changing the values of resistance changes the cut-off frequency without affecting quality. If it is desired to select among three cut-off frequencies, then line 72 would carry two bits of information to properly address the switches.

Figure 3:
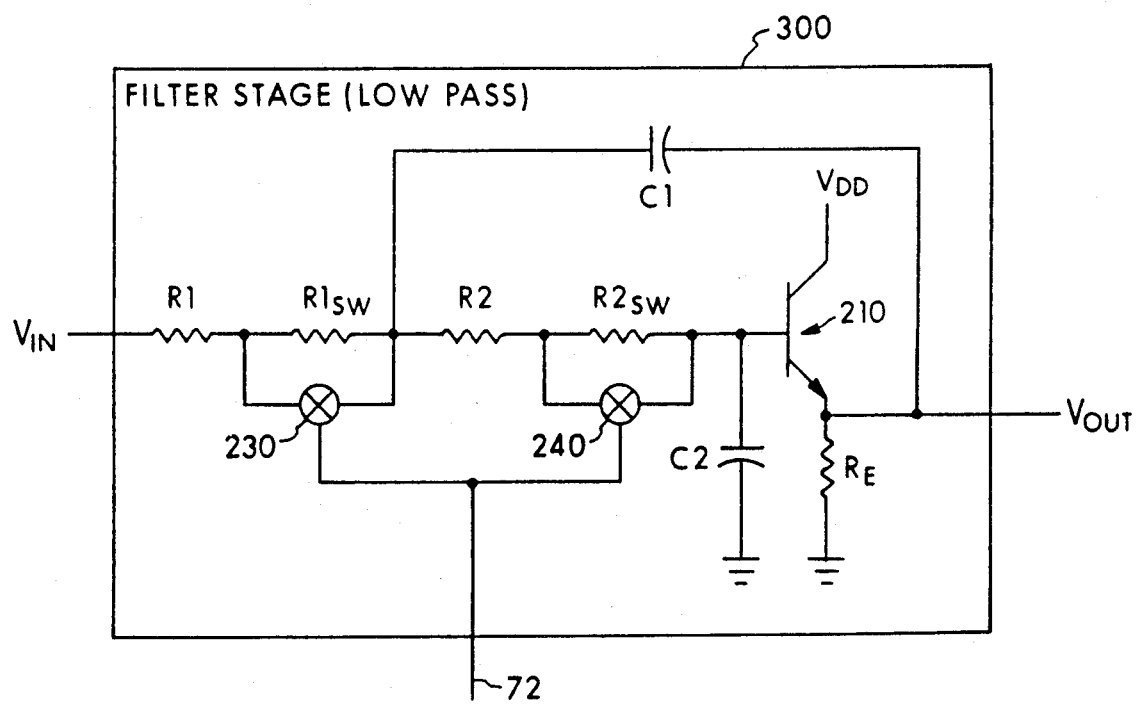
FIG. 3 sets forth an alternate embodiment of the low pass filter stage of FIG. 2.

FIG. 3 illustrates a series version of the filter stage 200 of FIG. 2. Rather than interconnecting resistances in parallel as set forth in FIG. 2, the same effect can be achieved by interconnecting resistances in series. Hence, when switches 230 and 240 are activated (i.e., signal on line 72 is LOW), resistances R1$_{SW}$ and R2$_{SW}$ are short circuited and the filter stage 300 operates at the R/2 cut-off frequency. With switches 230 and 240 not activated, resistances R1$_{SW}$ and R2$_{SW}$ are placed in series and the cut-off frequency is based upon the value of R.

Figure 4:
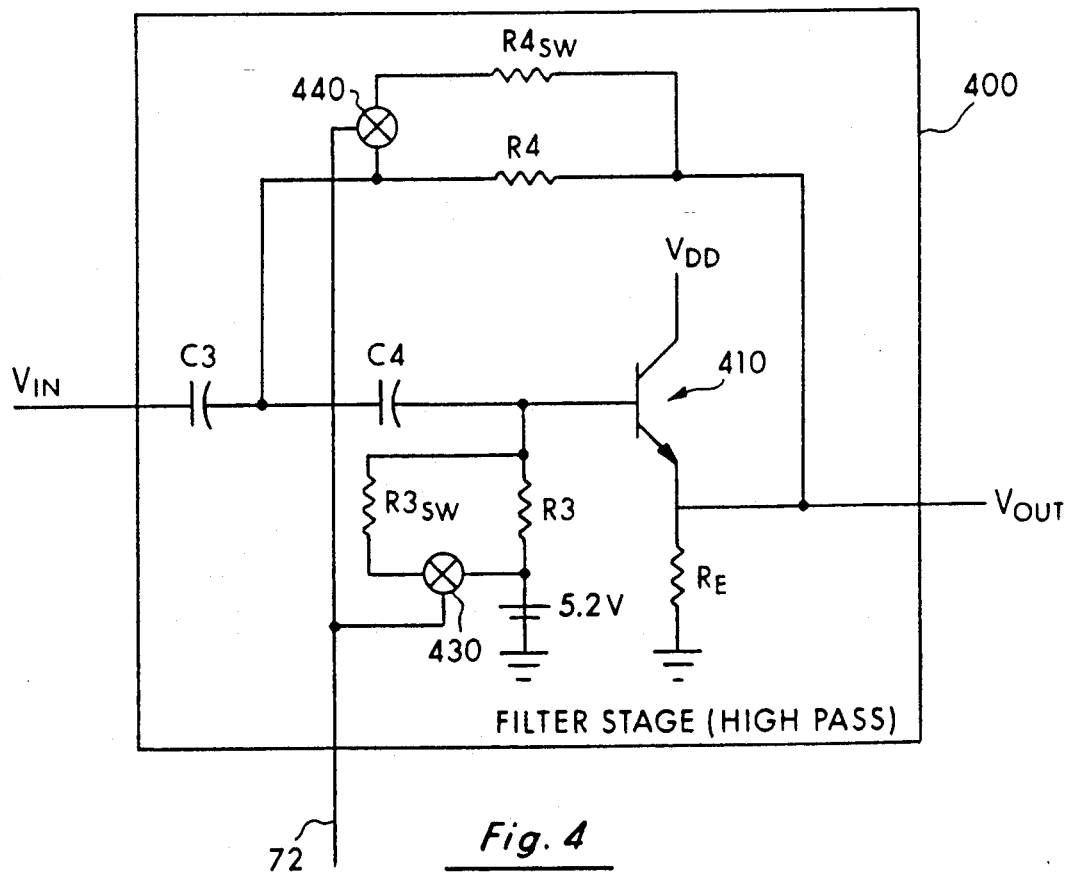
FIG. 4 sets forth the schematic of the high pass filter stage of the present invention.

In FIG. 4, the filter stage 400 for a high pass filter is set forth. The high pass filter stage of FIG. 4 is used to transfer the high frequency regions of the inverted input signal on line 34.

The high pass filter stage of FIG. 4 is selected such that its denominator polynomials (i.e., its $\omega_0$ and Q) are identical to that of the first low pass stage. Therefore, the two stages can be subtracted to produce equally spaced left and right half plane zeroes in the complex frequency plane:

FORMULA 5: (high pass)

$$H_1(s) = \frac{s^2}{s^2 + s\frac{\omega_0}{Q} + \omega_0^2}$$

FORMULA 6: (low pass)

$$H_2(s) = \frac{\omega_0^2}{s^2 + s\frac{\omega_0}{Q} + \omega_0^2}$$

FORMULA 7:

$$H_1(s) - H_2(s) = \frac{s^2 - K\omega_0^2}{s^2 + s\frac{\omega_0}{Q} + \omega_0^2}$$

where K controls the proportions of the high and low pass stages being summed.

Therefore, the zeros are at:

FORMULA 8:
$$s^2 - K \cdot \omega_0^2 = 0$$

$$s_1 = +\sqrt{(K)} \cdot \omega_0$$

$$s_2 = -\sqrt{(K)} \cdot \omega_0$$

Since the real-axis zeros are equally spaced from the imaginary axis, the magnitude characteristic of the filter is modified independent of the phase. With the proper selection of K, peaking may be added to the filter's magnitude response without affecting its phase response.

The transfer function for this filter stage 400 is set forth in FORMULA 9 below:

$$\frac{V_{out}}{V_{in}} = \frac{s^2}{s^2 + s\frac{\omega_0}{Q} + \omega_0^2}$$

Again, the quality, Q is found is FORMULA 10:

$$Q = 1/2 \sqrt{\frac{R3}{R4}}$$

Finally, the cut-off frequency $\omega_0$ is found in FORMULA 11:

$$\omega_0 = \frac{1}{\sqrt{R_3 R_4} \, C}$$

The above assumes C3=C4=C

As before, selectively connecting resistances $R3_{SW}$ and $R4_{SW}$ in parallel with resistors R3 and R4 does not affect the quality of the filter. In the preferred embodiment, the following values are utilized:

R3=$R3_{SW}$=2 Kilo-ohms
R4=$R4_{SW}$=2 Kilo-ohms
C3=120 picoFarads
C4=120 picoFarads
$R_E$=680 ohms
Transistor 410=Model MMBTH10
Switches 430, 440=Model HC4066

Again, it is to be expressly understood that these are preferred values. Again, the high pass filter stage of FIG. 4 could also be reconfigured according to the teachings of FIG. 3 into a series resistance approach.

The present invention is not to be limited by a parallel or series approach nor by the particular values set forth above. For example, the same effect could be obtained by switching capacitors rather than resistors. This approach is less desirable due to their cost relative to resistors and due to the fact that the resistance of the switch cannot be absorbed into the value of the capacitor. Hence, the embodiments of FIGS. 3 and 4 are preferable since the resistance of the switches 430 and 440 can be taken into account to more accurately design the filter stage. The filter stage of the present invention is fully implemented with a resistor and capacitor network formed as a network to have at least two cut-off frequencies. No inductors are utilized.

Composite Programmable Filter a. General Configuration

Figure 5:
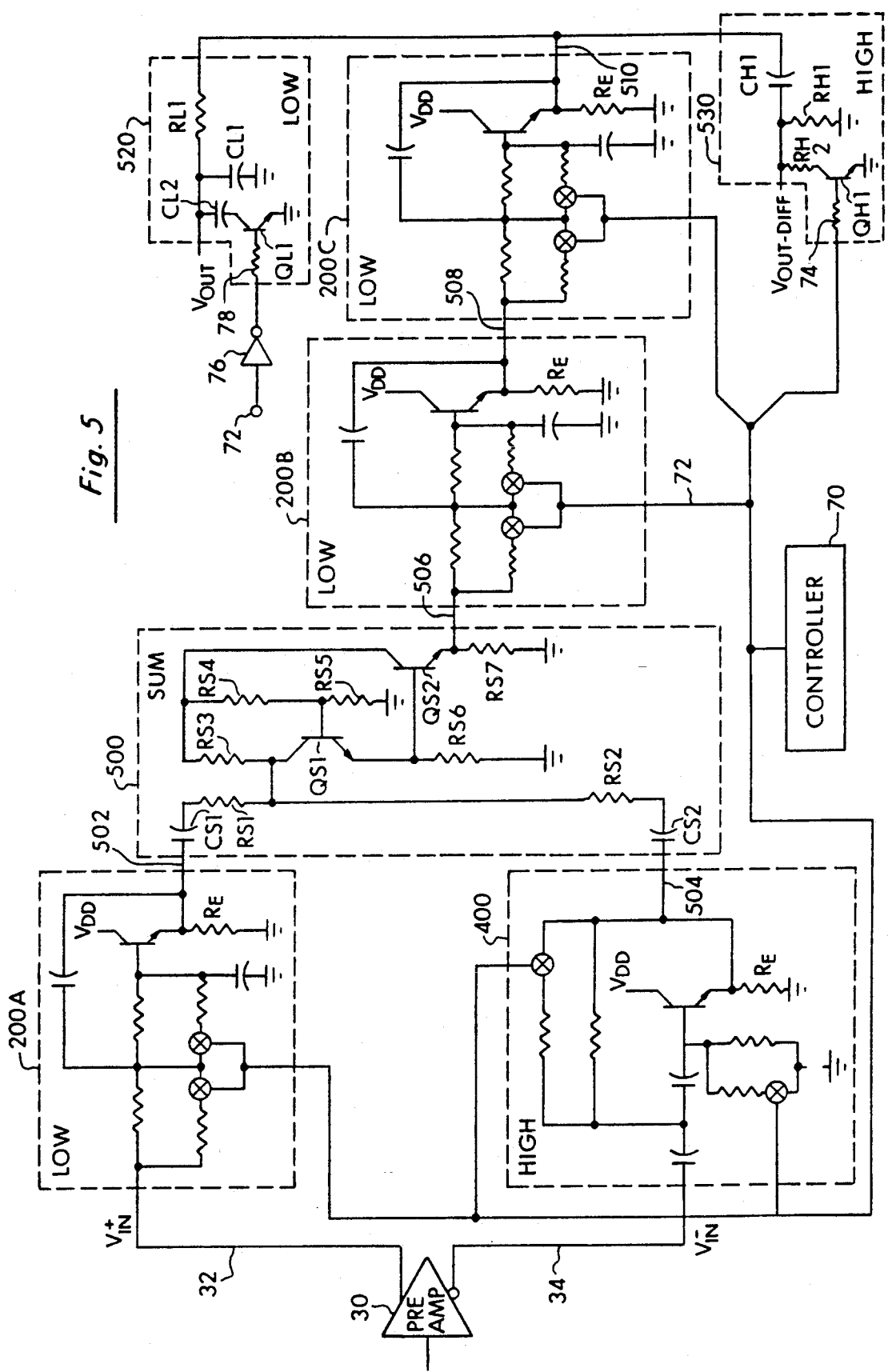
FIG. 5 sets forth the circuit diagram of the programmable filter/equalizer of the present invention.

The entire programmable filter of the present invention is shown in FIG. 5. In FIG. 5, the preamp 30 delivers a non-inverted signal on line 32 and an inverted signal on line 34. The signals on lines 32 and 34 are 180 degrees out of phase with each other. The non-inverted input on line 32 is delivered into a low pass filter 200A which delivers a filtered output on line 502. This inputs a summer circuit 500. Likewise, the inverted input voltage on line 34 is delivered into a high pass filter stage 400 whose output is delivered on line 504 to the summer circuit 500. The summer circuit 500 sums the two signals together and provides an output on line 506 which is inputted into a second low pass filter circuit 200B whose output 508 is delivered into a third low pass filter 200C. The output of filter 200C is delivered on line 510 to a low pass filter circuit 520 which delivers the $V_{out}$ signal. The output of filter 200C is also delivered to a high pass filter 530 which delivers the $V_{out\text{-}diff}$ signal.

Low pass filter stages 200A, 200B, and 200C correspond to that disclosed in FIG. 2. The high pass filter stage 400 corresponds to that discussed with respect to FIG. 4. They have the following values in the preferred embodiment:

| Low pass filter 1 (200A) |
|---|
| C1 = 270 picoFarad |
| C2 = 220 picoFarad |
| $R_E$ = 1.3 kilo-ohms |
| Low pass filter 2 (200B) |
| C1 = 330 picoFarad |
| C2 = 180 picoFarad |
| $R_E$ = 1.2 kilo-ohms |
| Low pass filter 3 (200C) |
| C1 = 560 picoFarad |
| C2 = 82 picoFarad |
| $R_E$ = 680 Ohms |

Figure 6:
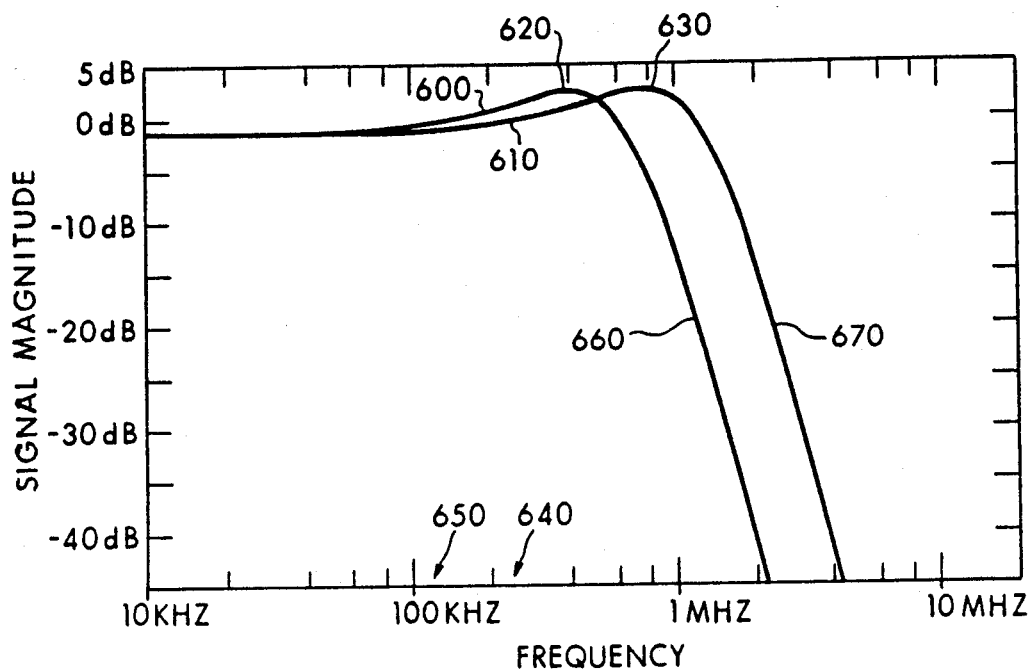
FIG. 6 graphically depicts the signal magnitude response of the filter of the present invention over a frequency range of 10 KHz to 10 MHz.

In FIG. 6, the magnitude response of the circuit over a 10 KHz-10 MHz frequency range is shown. Curve 600 is the magnitude response for the lower transfer rate (for example, 500 Kb/s for a selection between 500 and 1000 Kb/s). Curve 610 is the magnitude response of the filter of FIG. 5 for the higher data transfer rate. It can be readily observed that switching resistors in the filter to accommodate either the high or low transfer speeds does not result in a degradation of the filter characteristics for the lower transfer speed.

b. Intersymbol Interference

Intersymbol interference is a term used in communication channels to describe the phenomenon by which adjacent pulses interact, affecting each other's shape and position. Intersymbol interference as defined here is a linear process which arises from the finite bandwidth of the recording channel. Uncorrected, this leads to timing errors when the peaks are detected from the differentiated signal. It has been shown that amplifying the higher frequency components of the recorded signal can significantly reduce intersymbol interference.

Both curves 600 and 610 undergo a peak 620 and 630 respectively, which contributes to reducing intersymbol interference by pulse slimming which will be discussed in greater detail later.

Figure 9:
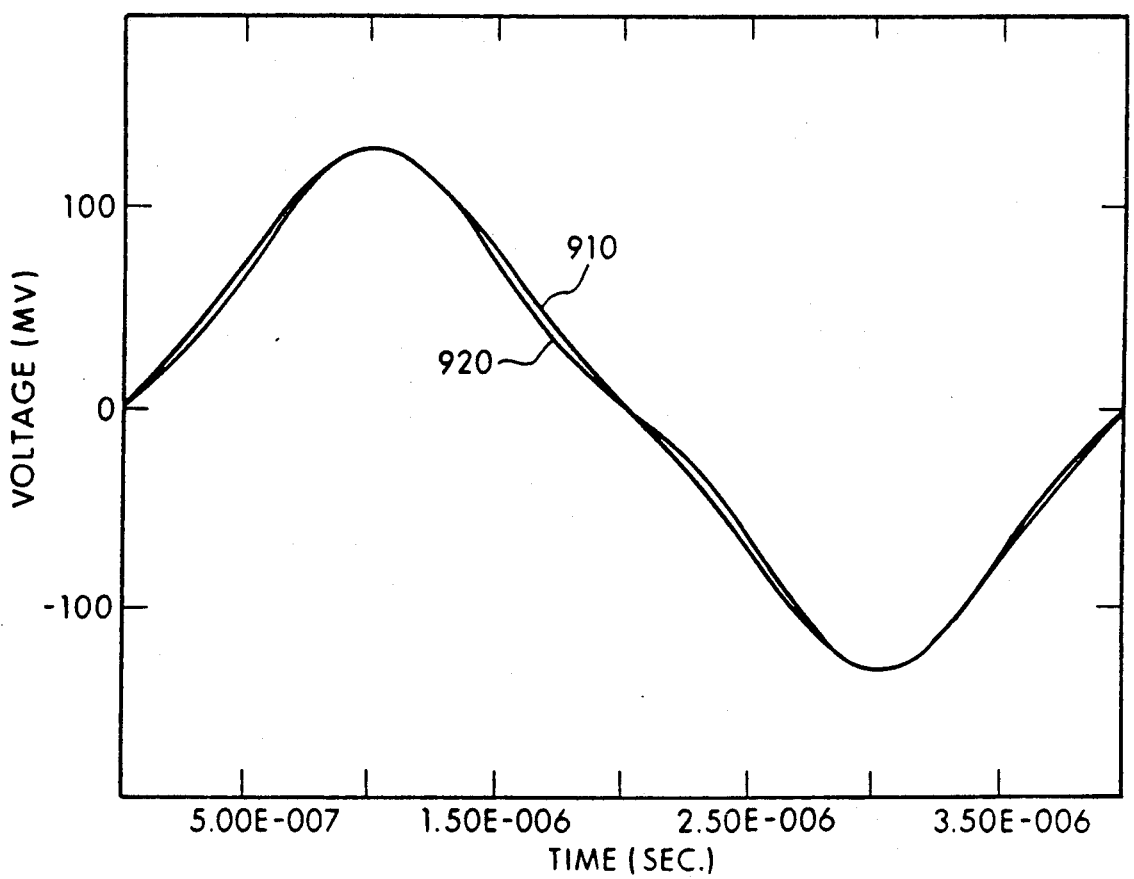
FIG. 9 graphically depicts the pulse slimming characteristic of the present invention.

The effect of the peaking on the read data waveform can be seen by examining the following fixed frequency case. If we assume a 500 Kb/s transfer rate the filter transfer function will be as displayed in FIG. 6 with peak 620. A fixed frequency 125 KHz signal is read from the tape; a Fourier transform of this signal reveals that it is composed of only odd harmonics. It will therefore have a third harmonic at 375 KHz which will be amplified relative to its fundamental by approximately 3-4 dB (from FIG. 6) FIG. 9 shows the resulting signal 920 relative to the original signal 910. It can be seen that the peak has sharpened slightly and the pulse slimmed by the amplification of the higher frequency harmonics. These same concepts can be extrapolated to cover the case when the data is not of fixed frequency. The purpose of pulse slimming is to restore the pulses being read from the tape 35 by utilizing the higher frequency harmonics so as to prevent smearing as commonly occurs as the signals are being stored on the media.

Figure 7:
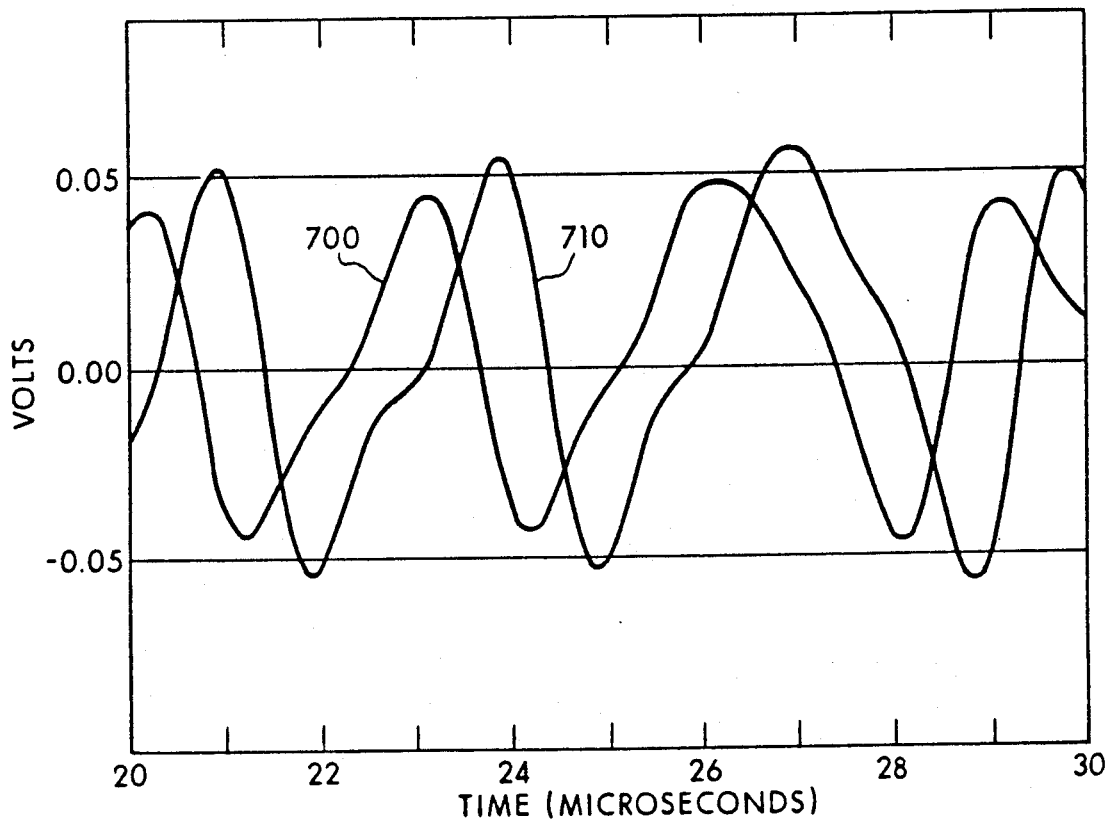
FIG. 7 compares the non-inverted input signal to the output of the programmable filter of the present invention.

This is better shown by reference to FIG. 7. In FIG. 7, a curve 700 shows an actual non-inverted voltage input pulse on line 32 of FIG. 5. The output of the filter of FIG. 5 which is termed $V_{out}$ is shown as curve 710. Notice how the output waveform 710 is slimmer than input waveform 700.

Figure 8:
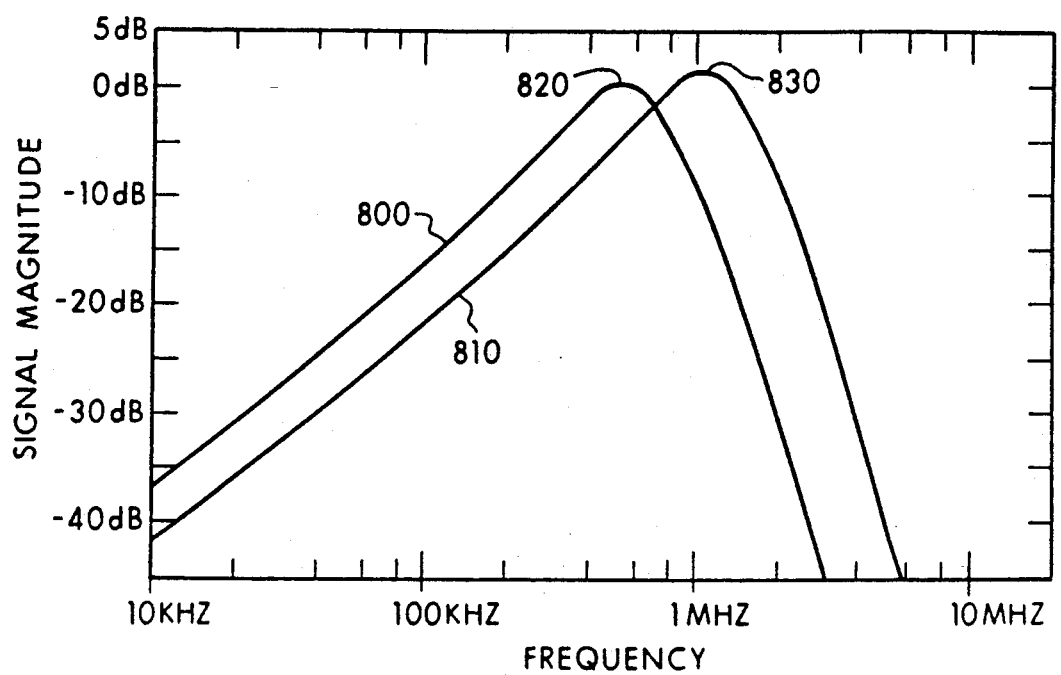
FIG. 8 graphically depicts the signal magnitude response for the $V_{out\text{-}diff}$ of the present invention over the frequency range of 10 KHz to 10 MHz.

In FIG. 8, the magnitude response versus frequency of $V_{out\text{-}diff}$ output is shown, respectively, for the two transfer rates. In FIG. 8, curve 800 corresponds to the lower transfer rate and curve 810 corresponds to the higher transfer rate. Curve 800 peaks at 820 and curve 810 peaks at 830.

It can readily be observed that switching resistors in the filter to accommodate either high or low transfer rates does not result in a degradation of the filter characteristics but rather only frequency scales the magnitude response.

Both curves in FIGS. 6 and 8, for example, 600 and 800, undergo peaks (620 and 820) in the magnitude response which contribute to reducing intersymbol interference in the channel. To reduce intersymbol interference, the outputs of stages 200A and 400 are summed together at the summer 500. The summer 500 is designed to add the signals appearing on leads 502 and 504 together. The summer is of conventional design and in the preferred embodiment comprises the following values:

CS1 = 0.22 microFarads
CS2 = 1.00 microFarads
RS1 = 604 ohms
RS2 = 120 ohms
RS3 = 182 ohms
RS4 = 1.47 Kilo-ohms
RS5 = 4.53 Kilo-ohms
RS6 = 604 ohms
RS7 = 750 ohms
QS1 = Model MPSH81
QS2 = Model MMBTH10

The amount of pulse slimming is controlled through the summing 500 of the high-pass and low-pass responses. Increasing the amount of the high-pass filter 400 output 504 relative to the low-pass filter 200A output 502 in the summer 500 results in greater pulse-slimming, and this corresponds to increased peaking of the magnitude response. Peaking of the magnitude response has its disadvantages, including amplifying noise in this frequency range reducing the overall signal-to-noise ratio. Therefore, a limit exists, defined by the amount of noise in the channel, as to the amount of pulse-slimming which may be implemented.

c. Reduction of Noise

Low pass filter stages 200B and 200C are cascaded together to increase the rate of roll-off in order to reduce noise at higher frequencies.

The low pass filter stages 200B and 200C serve to increase the roll-off characteristics of the filter 50 as shown by portions 660 and 670 of FIG. 6. The use of two cascaded filters at this point provides greater roll-off characteristics than if only one stage were utilized. Roll-off 660 and 670 is important under the teachings of the present invention. The more filter stages 200B and 200C that are cascaded together, the sharper the roll-off 660 and 670. Therefore, while permitting passage of the necessary harmonics at peaks 620 and 630, the stages significantly filter noise at the higher frequencies.

d. Identical Delays

The output on line 510 from the cascaded filters 200A, 400, 200B, and 200C is now delivered into a low pass filter 520 and into a high pass filter 530. The low pass filter 520 delivers $V_{out}$ and the high pass filter 530 delivers $V_{out\text{-}diff}$.

The low pass filter 520 is a simple RC single pole filter having the following values:

RL1 = 750 ohms
CL1 = 180 picoFarads

When the controller 70 issues a LOW signal on line 72, the filter of FIG. 5 is configured into the lower transfer rate. A LOW signal on line 72 is delivered through inverter 76 to resistor 78 to the base of transistor QL1 which turns on to place in parallel capacitor CL2. Capacitor CL2 has a value of 180 picoFarads. This places additional capacitance in parallel with capacitor CL1.

The function of the last low pass stage is to provide a signal substantially free of noise to the pulse qualification circuitry. It is a further objective to have its group delay matched to that of the differentiated signal for reasons to be explained later. These poles must also be scaled in frequency when the transfer rates are changed. Transistors QL1 and QH1 (2N3904) are configured as a switch to scale the frequency response of the final low pass and high pass stages.

In the low pass stage, capacitor CL2 is switched in parallel with CL1 while operating at the lower transfer rate. Since CL1 = CL2 the effect is to reduce the frequency of the pole of the filter by two (from 1.180 MHz to 590 KHz).

The high pass filter is also a simple one pole high pass filter having the following values:

RH1 = 820 ohms
CH2 = 330 picoFarads

When controller 70 issues a HIGH on line 72, the HIGH is delivered through resistor 74 to the base of transistor QH1. This turns transistor QH1 on placing RH2 in parallel with RH1. This scales the filter for the high frequency transfer rate. When the controller 70 issues a LOW (corresponding to the lower transfer speed), then transistor QH1 turns off. The pole is then determined by RH1 and CH1. Resistor RH2 has a value of 820 ohms.

The function of the high pass stage is to differentiate the signal from the tape. Differentiating the signal transforms the peaks of the signal into zero-crossings; the zero-crossing may then be easily detected and converted to a digital signal which is decoded by the floppy disk controller.

It can be appreciated in FIG. 5 that the provision of $V_{out}$ from low pass filter 520 and of $V_{out\text{-}diff}$ from high pass filter 530 have the identical delay. The provision of $V_{out}$ from the low-pass filter 520 and $V_{out\text{-}diff}$ from the high-pass filter 530 with the same delay is important. The equally delayed signals are provided to the pulse detector for peak detection and qualification, respectively. This is achieved by setting the denominator polynomials equal to each other for both the low-pass and high-pass stages 520 and 530 as found in FORMULAS 12 AND 13:

$$\frac{1/RC}{s + 1/RC}, \text{ for low-pass stage } 520$$

$$\frac{s}{s + 1/RC}, \text{ for high-pass stage 530}$$

Therefore, the only difference between the high pass and the low pass outputs is the multiplication by "s" and a scale factor of RC. Multiplication by "s" in the complex frequency domain is identical to differentiation in the time domain.

Figure 10:
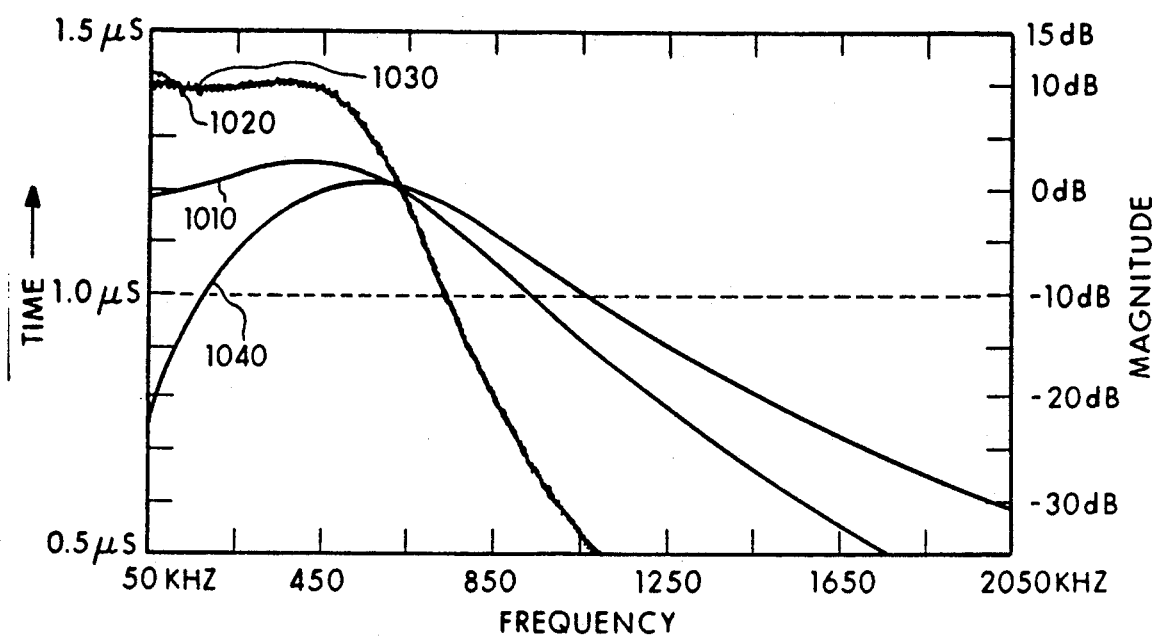
FIGS. 10 and 11 graphically depict the group delay plots for the low and high transfer rates, respectively.
Figure 11:
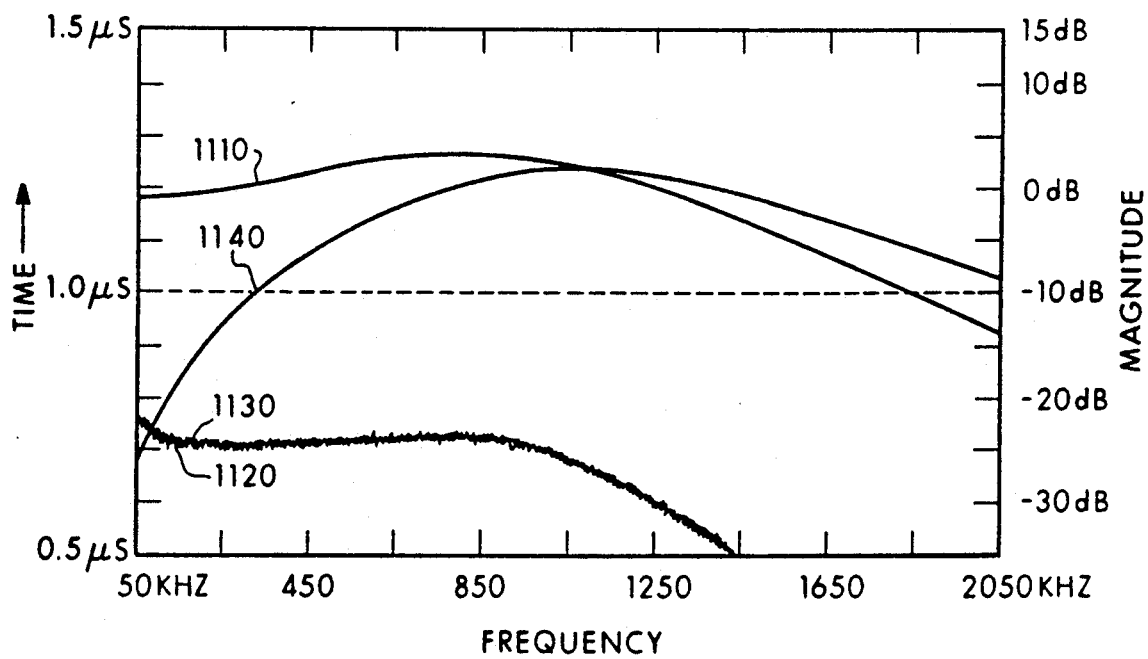

FIGS. 10 and 11 show the group delay for both the filtered and differentiated outputs for the low and high transfer rates, respectively. In FIG. 10 note that the group delay (time vs. frequency) is flat over the passband and this equates to little phase distortion in the equalized signal. Further note that both the filtered output's group delay, 1020, and the differentiated output's group delay, 1030, are nearly identical. The magnitude responses (dB vs. frequency) for the filtered output, 1010, and differentiated output, 1040, are shown for reference. FIG. 11 displays the same responses for the higher transfer rate. Curves 1120 and 1130 are the filtered and differentiated group delay responses, respectively, while curves 1110 and 1140 are the magnitude responses for the filtered and differentiated outputs.

It is to be expressly understood that the claimed invention is not to be limited to the description of the preferred embodiment but encompasses other modifications and alterations within the scope and spirit of the inventive concept.

We claim:

1. A programmable filter stage for filtering an input voltage over at least two cut-off frequencies, said programmable filter stage comprising:
   means for inputting said input voltage into said programmable filter stage;
   means connected to said inputting means for filtering said input voltage; and
   means connected to said filtering means for delivering the filtered voltage out of said programmable filter stage; said filtering means including:
   (a) first means for providing the first of said at least two cut-off frequencies at a predetermined level of quality of said filtered voltage, said first providing means being comprised of a resistor and capacitor network formed as a filter having said first of said at least two cut-off frequencies;
   (b) second means selectively connectable to said first providing means for providing a second of said at least two cut-off frequencies by modifying the impedance of said resistor and capacitor network while maintaining said predetermined level of quality of said filtered voltage; and
   (c) means connected to said second providing means for connecting said second providing means to said first providing means so as to select one of said at least two cut-off frequencies and wherein said quality of said filtered voltage remains at the predetermined level and is independent of which cut-off frequency is selected.

2. The programmable filter stage of claim 1 wherein said first providing means comprises:
   a first filter circuit having a first resistance value providing said first of said at least two cut-off frequencies at said predetermined level of quality; and
   wherein said second providing means comprises:
   (a) means having a second resistance value; and
   (b) means operably connected to said connecting means for selectively switching said second resistance value means into series connection with said first resistance value of said first filter circuit to provide said second of said at least two cut-off frequencies at said predetermined level of quality.

3. The programmable filter stage of claim 1 wherein said first providing means comprises:
   a first filter circuit having a first resistance value providing said first of said at least two cut-off frequencies at said predetermined level of quality; and
   wherein said second providing means comprises:
   (a) means having a second resistance value; and
   (b) means operably connected to said connecting means for selectively switching said second resistance value means into parallel connection with said first resistance value of said first filter circuit to provide said second of said at least two cut-off frequencies at said predetermined level of quality.

4. The programmable filter stage of claim 2 or claim 3 wherein said first resistance value and said second resistance value are provided by high precision resistors having a tolerance of one percent or less.

5. The programmable filter stage of claim 2 or claim 3 wherein said first resistance value and said second resistance value are provided by resistors of equal value.

6. The programmable filter stage of claim 5 wherein said resistors have a precision of one percent or less.

7. The programmable filter stage of claim 1 wherein said connecting means comprises:
   solid state switch means, and
   a microprocessor operating said solid state switch means to selectively connect said second providing means to said first providing means when said second of said at least two cut-off frequencies is desired.

8. A programmable filter stage for filtering the input voltage delivered from the read channel of a magnetic recording device, said programmable filter stage comprising:
   means for inputting said input voltage into said programmable filter stage;
   a first resistor and capacitor filter circuit connected to said input means, said first filter circuit having a first resistance value for providing a first cut-off frequency at a predetermined level of quality to said input voltage;
   means having at least one additional resistance value;
   means for switching each of said at least one additional resistance value means into connection with said first filter circuit to change the cut-off frequency characteristics of the filtered voltage to a different cut-off frequency while maintaining said predetermined level of quality;
   means connected to said switching means for activating said switching means to select one of said first cut-off frequency and said different cut-off frequency; and
   means for delivering said filtered voltage at said selected cut-off frequency and said predetermined level of quality out of said programmable filter stage.

9. The programmable filter stage of claim 8 wherein said connection between said first filter circuit and said at least one additional resistance value means connects said first filter circuit and said at least one additional resistance value means in series.

10. The programmable filter stage of claim 8 wherein said connection between said first filter circuit and said at least one additional resistance value means connects said first filter circuit and said at least one additional value means in parallel.

11. The programmable filter stage of claim 8 wherein said activating means includes a microprocessor operable to switch between said first filter circuit and said at least one additional resistance value means to select between said first cut-off frequency and said different cut-off frequency.

12. The programmable filter stage of claim 8 wherein said switching means comprises solid state switches connected between said first filter circuit and said at least one additional resistance value means.

13. A programmable low pass filter comprising:
a resistor-capacitor filter having a transistor, two resistors connected in series between an input voltage and the base of said transistor, a first capacitor connected between said two resistors and the emitter of said transistor and a second capacitor connecting the base of said transistor to ground, said resistor-capacitor filter providing a filtered voltage having a first cut-off frequency at a predetermined quality,
a second resistance;
means for switching said second resistance into connection with said two resistors to change the cut-off frequency characteristics of said filtered voltage to a second cut-off frequency while maintaining said predetermined quality;
means for activating said switching means to select one of said first and second cut-off frequencies of said filtered voltage; and
means for delivering said filtered voltage at said selected cut-off frequency and said predetermined quality out of said programmable low pass filter.

14. The programmable filter stage of claim 13 wherein said second resistance includes a second set of two resistors; and said connection between said first two resistors in series and second set of two resistors in series connects each one of said second set of resistors in series with a different one of said first set of resistors.

15. The programmable filter stage of claim 13 wherein said second resistance includes a second set of two resistors; and said connection between said first two resistors in series and second set of two resistors in series connects each one of said second set of resistors in parallel with a different one of said first set of resistors.

16. The programmable filter stage of claim 13 wherein said activating means includes a microprocessor operating to switch between said first filter circuit and said second resistance to select between said first cut-off frequency and said second cut-off frequency.

17. The programmable filter stage of claim 16 wherein said switching means include solid state switches connected between said first filter circuit and said second resistance.

18. The programmable filter stage of claim 17 wherein all of said resistors have a tolerance of one percent or less.

19. The programmable filter stage of claim 18 wherein all of said resistors are of equal value.

20. A programmable filter for filtering and equalizing the input signals delivered at a given transfer rate from a magnetic recording device, said magnetic recording device operating at a plurality of different transfer rates, said programmable filter comprising:
a plurality of cascaded low pass filter stages receptive of said input signals from said magnetic recording device, each of said low pass filter stages having means for selectively changing the cut-off frequency of said programmable filter to correspond to any one of said plurality of transfer rates so as to provide a unique cut-off frequency for said programmable filter corresponding to said given transfer rate of said input signals from said magnetic device, said changing means maintaining a predetermined level of quality for said programmable filter independent of the provided unique cut-off frequency;
means connected to said changing means for activating said changing means to select said unique cut-off frequency corresponding to said given transfer rate.

21. The programmable filter of claim 20 further comprising:
means connected to said programmable filter for providing a filtered voltage output corresponding to said input signals, and
means connection to said programmable filter for producing a differentiated voltage output having a time delay identical to said filtered voltage output.

22. A programmable filter for filtering and equalizing the input signals from a magnetic recording device, said output signals corresponding to data on said magnetic media, said programmable filter comprising:
two or more cascaded low pass filter stages receptive of said input signals, each of said low pass filter stages having means for selectively changing the cut-off frequency of said programmable filter according to the transfer rate of signals from said magnetic media, said changing means maintaining a predetermined level of quality for each different cut-off frequency;
means connected to said changing means for activating said changing means to select a cut-off frequency correspondingly to a given transfer rate;
means connected to said programmable filter for providing a filtered voltage output corresponding to said input signals, and
means connected to said filter for producing a differentiated voltage output having a time delay identical to said filtered voltage output, and wherein said providing means comprises a first filter circuit having a first resistor-capacitor impedance value providing the first of said cut-off frequencies at said predetermined level of quality and wherein said producing means comprises:
(a) means having a second resistor-capacitor impedance value;
(b) means operably connected to said first filter circuit and said means having a second resistor-capacitor impedance value for selectively switching said means having a second resistor-capacitor impedance value into connection with said first filter circuit to provide a second of said cut-off frequencies at said predetermined level of quality.

23. The programmable filter of claim 22 wherein said connection between said first filter circuit and said means having a second resistor-capacitor impedance value connects said first filter circuit and said means having a second resistor-capacitor impedance value in series.

24. The programmable filter of claim 22 wherein said connection between said first filter circuit and said means having a second resistor-capacitor impedance value connects said first filter circuit and said means having a second resistor-capacitor impedance value in parallel.

25. The programmable filter of claim 22 wherein said switching means include digitally controlled switches between said first filter circuit and said means having a second resistor-capacitor impedance value.

26. The programmable filter of claim 25 wherein said switching means include a microprocessor providing digital control over said switches.

27. A method for filtering voltage input signals in a resistor-capacitor filter circuit at a predetermined level of quality over at least two cut-off frequencies, said circuit having a means with an additional impedance and means to selectively connect said additional impedance means to said filter circuit, said method comprising the steps:
  (a) inputting said voltage input signals into said filter circuit;
  (b) delivering said voltage input signals through said resistor-capacitor filter circuit at a first of said at least two cut-off frequencies and at said predetermined level of quality;
  (c) outputting said filtered voltage input signal from said filter circuit; and
  (d) activating said selectively connecting means to connect said additional impedance means to said resistor-capacitor circuit to deliver said voltage input signals over a second of said at least two cut-off frequencies while maintaining said predetermined level of quality.

28. The method of claim 27 wherein said step (b) further includes: connecting said additional impedance means in a parallel connection with said resistor-capacitor circuit.

29. The method of claim 27 wherein said step (b) further includes:
  connecting said additional impedance means in a series connection with said resistor-capacitor circuit.

30. The method of claim 27 wherein said selectively connecting means include solid state switches between said resistor-capacitor circuit and said additional impedance means, and said step (b) further includes:
  providing a digital signal to said solid state switches to activate said connection between said resistor-capacitor and said additional impedance means.

31. A method for filtering voltage input signals in a resistor-capacitor filter circuit at a predetermined level of quality over at least two cut-off frequencies, said circuit having means with an additional impedance and means to selectively connect said additional impedance means to said filter circuit, said method comprising the steps:
  (a) activating said connecting means to select one of said at least two cut-off frequencies;
  (b) inputting said voltage input signals into said filter circuit;
  (c) delivering said voltage input signals through said filter circuit to filter said signal over said selected one of said at least two cut-off frequencies while maintaining said predetermined level of quality independent of said selected frequency; and
  (d) outputting said filtered voltage input signal from said filter circuit.

32. The method of claim 31 wherein step (a) includes:
  activating said connecting means to send said voltage input signals over only said resistor-capacitor circuit to filter said signal over a first of said at least two cut off frequencies at said predetermined level of quality.

33. The method of claim 32 wherein said selectively connecting means include solid state switches between said resistor-capacitor circuit and said additional impedance means, and said step (b) further includes:
  providing a digital signal to said solid state switches to activate said connection between said resistor-capacitor and said additional impedance means.

34. The method of claim 31 wherein said step (a) further comprises:
  activating said connecting means to connect said additional impedance means to said resistor-capacitor circuit to deliver said voltage input signals at said predetermined level of quality over a second of said at least two cut-off frequencies.

35. The method of claim 34 wherein said step (a) further includes:
  said connection means connects said additional impedance means in a parallel connection with said resistor-capacitor circuit to select said second of said at least two cut-off frequencies.

36. The method of claim 34 wherein said step (a) further includes:
  connecting said additional impedance means in a series connection with said resistor-capacitor circuit.

* * * * *